(12) United States Patent
Dornfest et al.

(10) Patent No.: US 6,358,810 B1
(45) Date of Patent: Mar. 19, 2002

(54) METHOD FOR SUPERIOR STEP COVERAGE AND INTERFACE CONTROL FOR HIGH K DIELECTRIC CAPACITORS AND RELATED ELECTRODES

(75) Inventors: Charles Dornfest, Fremont; John Egermeier, San Jose; Nitin Khurana, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/123,690

(22) Filed: Jul. 28, 1998

(51) Int. Cl.⁷ .............................................. H01L 21/20
(52) U.S. Cl. ..................... 438/396; 438/652; 438/653
(58) Field of Search ............................ 438/396, 393, 438/399, 652, 653, 686

(56) References Cited

U.S. PATENT DOCUMENTS

| | | | |
|---|---|---|---|
| 5,242,860 A | * | 9/1993 | Nulman et al. ............. 438/653 |
| 5,489,548 A | * | 2/1996 | Nishioka et al. ............ 438/396 |
| 5,499,207 A | | 3/1996 | Miki et al. .................. 365/145 |
| 5,508,221 A | | 4/1996 | Kamiyama .................. 438/396 |
| 5,555,486 A | | 9/1996 | Kingon et al. .............. 361/305 |
| 5,619,393 A | * | 4/1997 | Summerfelt et al. ..... 361/321.1 |
| 5,635,741 A | * | 6/1997 | Tsu et al. ................... 257/310 |
| 5,656,852 A | | 8/1997 | Nishioka et al. ............ 257/632 |
| 5,751,540 A | * | 5/1998 | Lee et al. ................. 361/321.4 |
| 5,783,282 A | * | 7/1998 | Leiphart ..................... 428/138 |
| 5,824,563 A | | 10/1998 | Hwang ............................ 438/3 |
| 5,972,096 A | * | 10/1999 | Sawada et al. ......... 106/287.18 |
| 5,972,722 A | * | 10/1999 | Visokay et al. ................ 438/3 |
| 5,976,928 A | * | 11/1999 | Kirlin et al. ................. 438/240 |
| 6,162,698 A | * | 12/2000 | Yu .............................. 438/399 |
| 6,265,230 B1 | * | 7/2001 | Aggarwal et al. ............. 438/3 |
| 6,284,587 B1 | * | 9/2001 | Yamauchi .................... 438/240 |

FOREIGN PATENT DOCUMENTS

| | | |
|---|---|---|
| DE | 19630310 A1 | 1/1997 |
| EP | 0618597 A1 | 10/1994 |
| EP | 0697719 A2 | 2/1996 |
| EP | 0821415 A2 | 1/1998 |
| JP | 03257857 | 11/1991 |
| JP | 8-330544 | 12/1996 |
| JP | 08330544 | 12/1996 |

OTHER PUBLICATIONS

International Search Report for PCT/US99/17065, Nov. 5, 1999, 7 pages.

* cited by examiner

Primary Examiner—Carl Whitehead, Jr.
Assistant Examiner—Jamie L. Brophy
(74) Attorney, Agent, or Firm—Moser, Patterson & Sheridan, LLP

(57) ABSTRACT

The present invention provides a multi-layer semiconductor memory device comprising: a bottom electrode having a bottom layer, an upper interface layer and an intermediate tuning layer disposed between the bottom layer and the upper interface layer; a top electrode; and a high dielectric constant dielectric layer disposed between the bottom electrode and the top electrode. The present invention further provides an apparatus and a method for manufacturing high density DRAMs having capacitors having high quality HDC materials and low leakage currents. Another aspect of the present invention provides an electrode-dielectric interface that nucleates high quality HDC films. The present invention further provides an apparatus and a method for manufacturing capacitors within a high aspect ratio aperture.

37 Claims, 4 Drawing Sheets

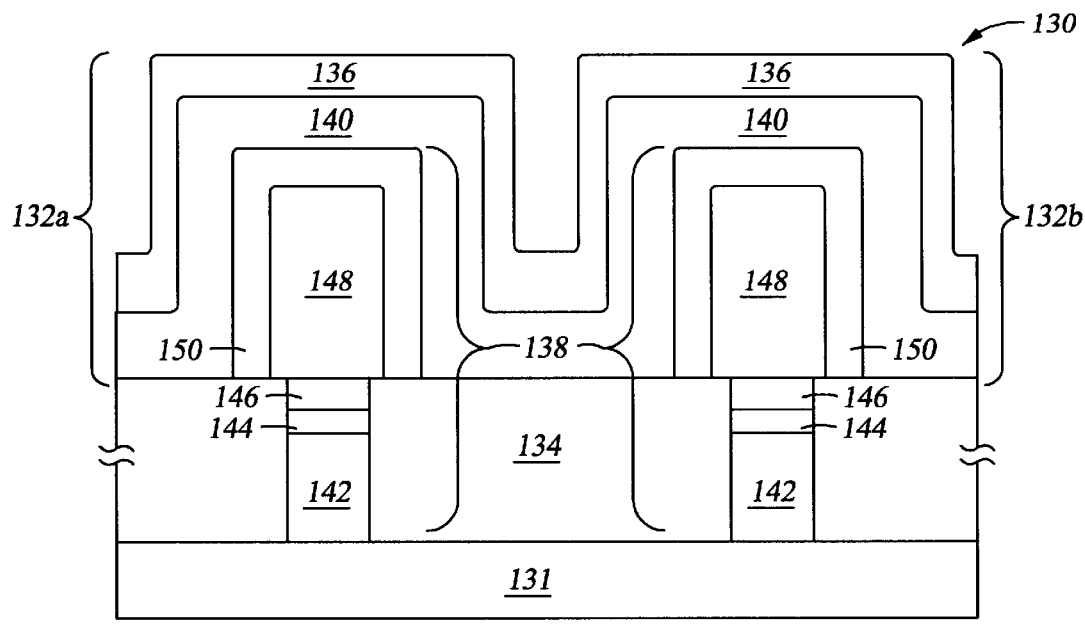
Fig. 6
Fig. 7
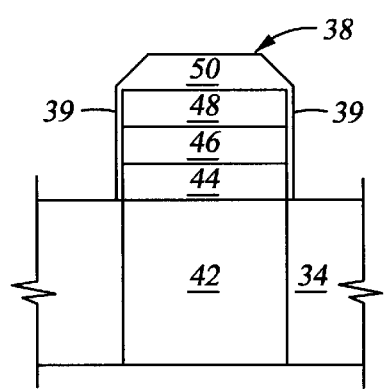
Fig. 2a
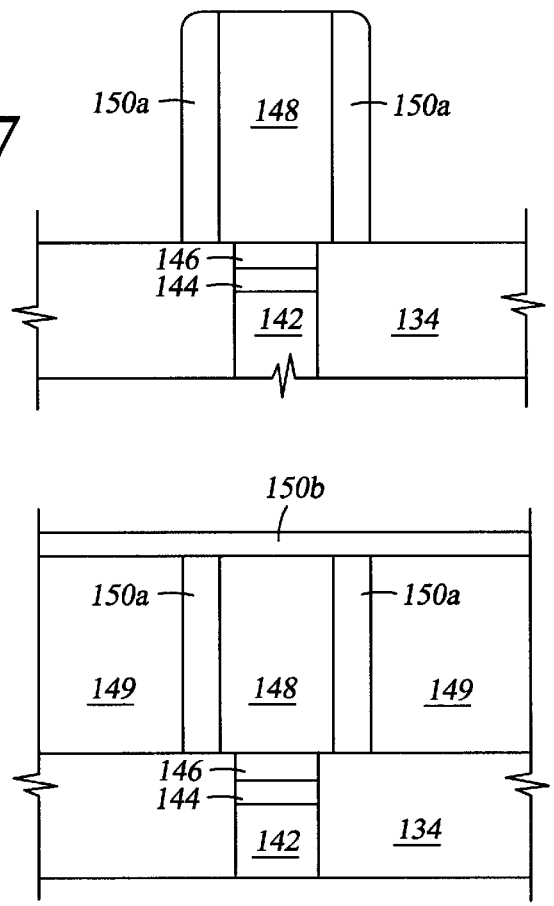
Fig. 8

METHOD FOR SUPERIOR STEP COVERAGE AND INTERFACE CONTROL FOR HIGH K DIELECTRIC CAPACITORS AND RELATED ELECTRODES

BACKGROUND OF THE INVENTION

1. Field of the Invention

The present invention generally relates to high density semiconductor devices. More particularly, the present invention relates to a method and apparatus for nucleating deposition of high quality, high-K dielectrics, providing low leakage current capacitors and optimizing step coverage for high aspect ratio features.

2. Background of the Related Art

Dynamic random-access memory (DRAM) integrated circuits are commonly used for storing data in a digital computer. Currently available DRAMs may contain over 16 million cells fabricated on a single crystal silicon chip, wherein each memory cell generally comprises a single transistor connected to a miniature capacitor. In operation, each capacitor may be individually charged or discharged in order to store one bit of information. A DRAM is dynamic in the sense that charged memory cells must be refreshed or recharged periodically to maintain data integrity. Otherwise, charged memory cells may discharge through leakage to a level where they no longer appear to be set to a charged state.

To facilitate construction of 64 MB, 256 MB, 1 GB and higher density DRAMs with correspondingly smaller-sized memory cells, capacitor structures and materials that can store the charge in smaller chip space are needed. High dielectric constant (HDC) materials (defined herein as having a dielectric constant greater than about 50) have been used successfully in such capacitor structures in many microelectronic applications, such as DRAM and infrared detectors. It is desirable that such materials used for DRAMs and other microelectronic applications be formable over an electrode and underlying structure without significant harm to the electrode and the underlying structure. It is also desirable to have the resulting device to have dielectric materials that exhibit low leakage current (i.e., the electrical current flowing from one electrode of the capacitor to the other electrode of the capacitor during operation of the capacitor) and consistent dielectric properties throughout the lifetime of the device and also possess high dielectric constants at frequencies of hundreds of MHz up to several GHz. Examples of HDC materials used in capacitor structures in microelectronic devices include lead lanthanium titanate (PLT), barium titanate, strontium titanate and barium strontium titanate (BST). Other materials that may be used in capacitor structures in non-volatile memory cells include ferroelectric materials, such as lead zirconate titanate (PZT) and strontium bismuth tantalate (SBT).

In a highly integrated device such as a 1 GB, the isolation widths between neighboring electrodes are approaching 0.3 $\mu$m or smaller, and the thickness of the electrodes are becoming larger than the isolation width. For example, FIG. 1 shows a sectional view of a prior art microelectronic device 8 having two capacitor structures 12a and 12b having a small isolation width 24 (<0.31 $\mu$m). The microelectronic device 8 includes an active device layer 10 (in which active devices such as transistors are formed with appropriate wirings and terminals) and two capacitor structures 12a and 12b, including two platinum bottom electrodes 14a and 14b, an insulator 16, an upper platinum electrode 18. Conductive plugs 20a and 20b connect the bottom electrodes 14a and 14b with devices in the active device layer 10 through an insulating layer 22. A coupling capacitance between the two neighboring electrodes 14a and 14b results because the isolation width 24 between the neighboring electrodes 14a and 14b is small (<0.3 $\mu$m) and the dielectric material between the electrodes 14a and 14b does not have a sufficiently high dielectric constant to prevent the coupling capacitance.

The coupling capacitance between neighboring electrodes 14a and 14b can cause instabilities in the circuit operation. This coupling capacitance causes instabilities in the circuit operation because the capacitance of each of the capacitor structures 12a and 12b is distorted by the coupling capacitance. For example, when the electrodes of the capacitors are charged during operation of the device, the coupling capacitance between the neighboring bottom electrodes 14a and 14b may become higher than the capacitance between the upper electrode 18 and each of the bottom electrodes 14a and 14b because of the small isolation width 24 (less than 0.3 $\mu$m) and the high aspect ratio (i.e., the height 26 of the bottom electrodes 14a and 14b is greater than the width 24 between the bottom electrodes 14a and 14b).

A further problem involving lateral leakage current occurs as a result of a decrease in the distance or isolation width 24 between the bottom electrodes 14a and 14b. The lateral leakage current is current that flows between bottom electrodes 14a and 14b when the capacitor structures 12a and 12b are charged up during operation. When the distance or isolation width 24 between neighboring electrodes 14a and 14b is greater than 1 $\mu$m, as in low level integration, the lateral leakage current is insignificant and not problematic because a sufficient amount of dielectric material separates the neighboring electrodes 14a and 14b. However, as the isolation width 24 approaches 0.3 $\mu$m and smaller, the lateral leakage current increases significantly to a problematic level that may cause breakdown of the capacitors. The lateral leakage current results because it is difficult to nucleate high k dielectric materials with adequate dielectric characteristics into the smaller isolation width between the neighboring electrodes 14a and 14b. In light of the above, proper nucleation of the high k dielectric material in these high aspect ratio isolation widths is needed to reduce the lateral current leakage and the coupling capacitance between the neighboring electrodes.

HDC materials, such as BST, have been deposited in bulk form and have stable properties. However, this is not true for thin film (200–300Å) properties of BST. For example, dielectric constant and leakage current are severely degraded as compared to bulk BST, that is, the dielectric constant reduces to about 10–20% of the dielectric constant of bulk BST and the leakage current increases to 5 to 10 times higher than the leakage current of bulk BST. Current methods of depositing BST films are unable to achieve the high dielectric constant and low leakage current required in applications in sub-micron devices that require BST film thickness less than 300 Å thick.

Therefore, there remains a need for an apparatus and a method for manufacturing capacitors having high quality HDC materials and low leakage currents between neighboring electrodes for use in high density DRAMs. There is also a need for a method for nucleating thin, high quality HDC dielectric films for use in high density semiconductor devices. There also remains a need for an apparatus and a method for manufacturing capacitors having high quality HDC materials and low leakage currents within a high aspect ratio aperture, particularly within features that are less than 0.31 $\mu$m wide.

SUMMARY OF THE INVENTION

The present invention provides a multi-layer semiconductor memory device comprising: a bottom electrode comprising a bottom layer, an upper interface layer and an intermediate tuning layer between the bottom layer and the upper interface layer; a top electrode; and a high dielectric constant layer disposed between the bottom electrode and the top electrode. Preferably, the bottom layer of the bottom electrode comprises a barrier material such as titanium or a combination of titanium and titanium nitride, and the upper layer of the bottom electrode comprises an interface material having high work function and oxidation resistance such as platinum, ruthenium, iridium, rhodium, platinum combined with rhodium, platinum combined with iridium, platinum combined with ruthenium and combinations thereof. Preferably, the tuning layer comprises a material such as ruthenium oxide ($RuO_2$), ruthenium combined with ruthenium oxide ($Ru/RuO_2$), iridium oxide ($IrO_2$), iridium combined with iridium oxide ($Ir/IrO_2$), titanium aluminum nitride (TiAlN) and combinations thereof. The top electrode preferably comprises the same material as the upper layer of the bottom electrode, and the preferred HDC material includes barium strontium titanate (BST), lead zirconate titanate (PZT), lead lanthanum titanate (PLT), barium titanate, strontium titanate and strontium bismuth titanate (SBT).

The present invention further provides a method for manufacturing capacitors for high density DRAMs having high quality HDC dielectrics and low leakage currents in a high aspect ratio device feature comprising: depositing a material by PVD and redepositing and distributing the same material using a high density plasma (HDP) PVD or a Pulsed DC Densifying Plasma.

Another aspect of the invention provides an electrode-dielectric interface that nucleates high quality HDC films. The present invention provides an interface layer that is tuned by an underlayer for optimal nucleation of the HDC film. Preferably, the tuning layer comprises a material such as ruthenium oxide ($RuO_2$), ruthenium combined with ruthenium oxide ($Ru/RuO_2$), iridium oxide ($IrO_2$), iridium combined with iridium oxide ($Ir/IrO_2$), titanium aluminum nitride (TiAlN) and combinations thereof The interface layer preferably comprises an interface material having high work function and oxidation resistance such as platinum, ruthenium, iridium, rhodium, platinum combined with rhodium, platinum combined with iridium, platinum combined with ruthenium and combinations thereof.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 2a is a cross sectional view of a bottom electrode having a tapered side wall comprising an interface material.

FIG. 6 is a cross sectional view of an alternative embodiment of the microelectronic device 30 having two alternative capacitor structures 32 of the present invention.

FIG. 7 is a cross sectional view of a tuning layer 48 having sides covered with a tapered layer 50a of an interface material.

FIG. 8 is a cross sectional view of a bottom electrode prior to an etch removal of excess material.

DETAILED DESCRIPTION OF THE PREFERRED EMBODIMENT

Figure 1:
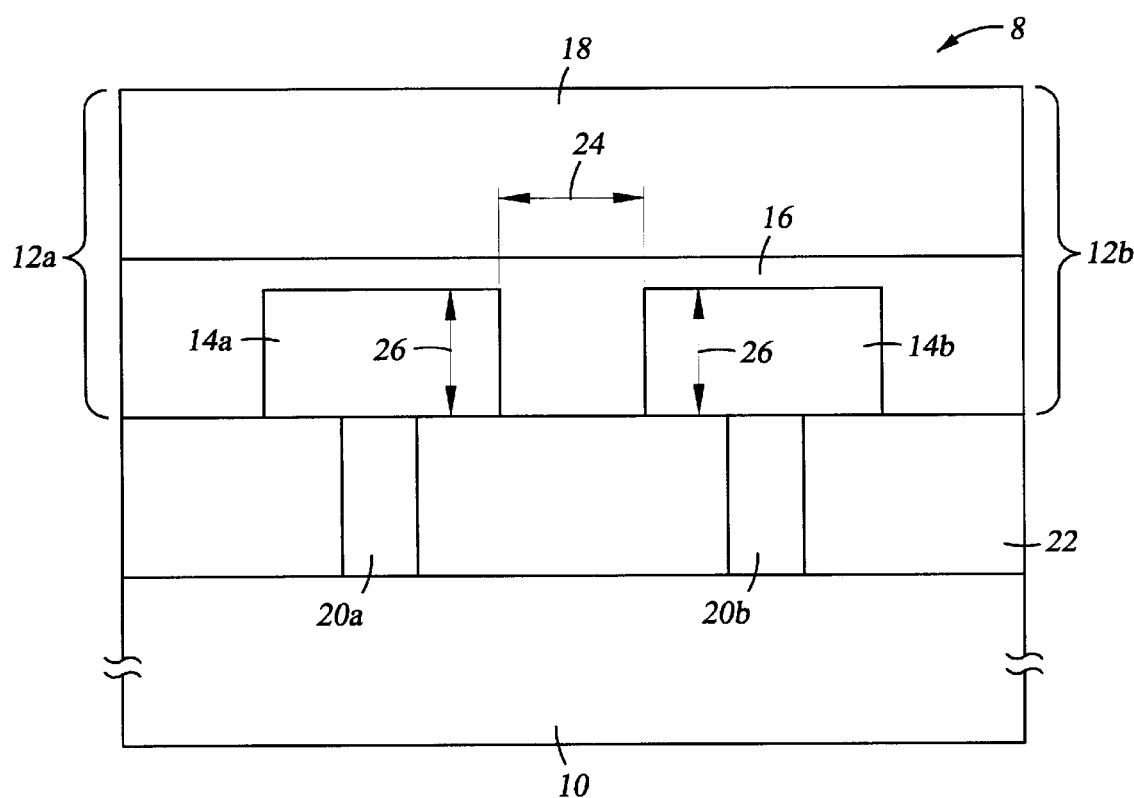
FIG. 1 is a sectional view of a prior art microelectronic device having two capacitor structures.
Figure 2:
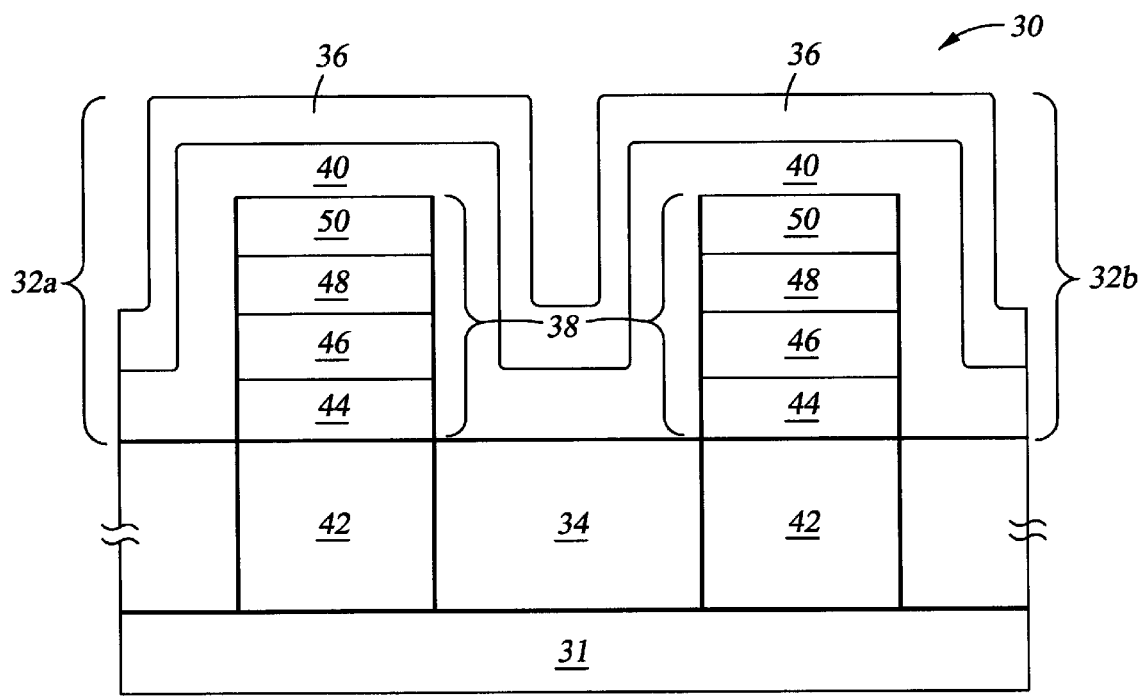
FIG. 2 is a sectional view of a microelectronic device 30 having two capacitor structures 32 of the present invention.

FIG. 2 is a sectional view of a microelectronic device 30 having two capacitor structures 32a and 32b of the present invention formed thereon. The microelectronic device 30 includes an active device layer 31 in which active devices (not shown) such as transistors are formed with appropriate wirings and terminals. An insulator layer 34, typically comprising silicon oxide ($SiO_2$) or other dielectric materials, insulates the active device layer 31 from other devices such as the capacitor structures 32a and 32b. Each of the capacitor structures 32a and 32b typically includes an upper electrode 36, a lower electrode 38 and a high k dielectric or HDC layer 40 separating the upper and lower electrodes. The capacitors are connected to the active device layer 31 at appropriate locations through conductive plugs 42, which are preferably comprised of polysilicon. The lower electrode 38 is preferably disposed directly above the polysilicon conductive plugs 42. The lower electrode 38, as contemplated by the present invention, preferably comprises layers of different materials. As illustrated in FIG. 2, the lower electrode 38 comprises a bottom layer 44, an intermediate barrier layer 46, a tuning layer 48 and an interface layer 50 forming the upper surface of the lower electrode 38.

The bottom layer 44 provides adhesion of the lower electrode 38 to the polysilicon conductive plug 42. The bottom layer 44 also serves as an initial barrier layer in addition to the intermediate barrier layer 46 that prevents diffusion of silicon and/or oxygen atoms through the lower electrode. Preferably, both the bottom layer 44 and the intermediate barrier layer 46 act as diffusion barriers between the electrode and the substrate material such as silicon, polysilicon or silicon oxide. The diffusion barriers prevent silicon in the substrate from diffusing through the electrode and forming silicon oxide at the interface between the lower electrode 38 and the HDC layer 40. The formation of silicon oxide causes breakdown of the capacitor function because of the resulting poor leakage control of the capacitor. The diffusion barriers also prevent diffusion of oxygen and other atoms from the processing environment or other upper level devices through the different layers of the lower electrode 38 into the substrate material or the devices connected to the lower electrode 38. Preferably, the diffusion barrier comprises a material such as titanium (Ti), titanium nitride (TiN), titanium aluminum nitride (TiAlN), tantalum (Ta), tantalum nitride (TaN), tantalum aluminum nitride (TaAlN) and combinations thereof As shown in FIG. 2, the lower electrode 38 includes a titanium layer 44, preferably between about 50 Å and about 500 Å thick, as well as a titanium aluminum nitride layer 46, preferably between about 50 Å and about 500 Å thick, both acting as diffusion barrier layers.

The multi-layered lower electrode 38 includes an interface layer 50 dedicated to optimize nucleation of a high quality, high k dielectric material for the resulting capacitor. It is critical to control interface stress, preferred grain growth and surface cleanliness at each nucleating surface, particularly the interface between the electrode and the dielectric. It is contemplated by the present invention that appropriate interface layers can solve these as well as other key problems involved with HDC material depositions. Specifically, for the preferred electrode configuration as shown in FIG. 2, the lower electrode 38 includes a top interface layer 50 comprising an interface material having high work function (i.e., the amount of energy required to eject an electron from a metal surface) and oxidation resistance such as a metal selected from the group comprising platinum, ruthenium, iridium, rhodium and combinations thereof. Alternatively, the interface material for the interface layer 50 which controls the BST electrode interface comprises a combination of platinum with ruthenium (Pt/Ru), a combination of platinum and iridium (Pt/Ir) or a combination of platinum with rhodium (Pt/Rh). These combinations can be used instead of platinum or other single noble metals to form the top layer of the lower electrode. The combination materials can be deposited by co-deposition of the electrode materials using a multi-metal PVD target or a CVD gas source. Preferably, platinum comprises between about 75% and about 90% of the combination material, and even more preferably, between about 80% and about 85%.

The interface layer 50, such as platinum, requires a controlled nucleation (i.e., nucleation in a particular orientation) to provide a controlled nucleation surface that matches the optimal crystal orientation for the subsequently deposited HDC film 40. In the case of BST used as the HDC material, BST naturally nucleates in the <100> or the <110> orientation and exhibits its optimal dielectric material properties (such as k value) with these crystal orientations. Because platinum naturally nucleates in the <111> orientation on silicon oxide/silicon (SiO$_2$/Si) wafers, the platinum/ silicon oxide/silicon (Pt/SiO$_2$/Si) electrode does not provide a controlled nucleation of BST having the <100> or the <110> crystalline structure in the BST layer deposited over the <111> platinum layer. For deposition of thin film stacks, a controlled nucleation is required because a subsequent film layer tends to take on the same crystal orientation of a previous film layer when the films have similar or compatible crystal structures. The crystal orientation of the first layer of a thin film stack can be proliferated throughout an entire stack because the subsequently deposited layers follows the predominant crystal structure of the first layer. Thus, the first layer becomes the tuning layer that tunes the crystal structure of the entire stack in a particular crystal orientation.

The invention improves the BST nucleation by "tuning" the platinum interface layer 50 with a tuning layer 48 that provides a clean, defined nucleating surface for the platinum such that the resulting platinum interface layer 50 provides a nucleating surface optimized for BST grain growth. Particularly, the tuning layer 48 matches the nucleation orientation of the interface material (i.e., platinum) with the nucleation orientation of the HDC material (i.e., BST). Specifically for BST, the tuning layer 48 provides the <100> or the <110> crystal orientation that matches the BST crystal orientation exhibiting the optimal dielectric properties. The crystal orientation is proliferated throughout the stack, including the interface layer 50 and the HDC layer 40. The tuning layer 48 preferably comprises a material such as ruthenium oxide (RuO$_2$), ruthenium combined with ruthenium oxide (Ru/RuO$_2$), iridium oxide (Ir/IrO$_2$), iridium combined with iridium oxide (Ir/IrO$_2$), titanium aluminum nitride (TlAlN) and combinations thereof. Preferably, the tuning layer 48 is deposited by PVD to a thickness of about 50 Å to about 1000 Å, and the platinum interface layer 50 is preferably deposited by PVD over the tuning layer 48 to a thickness of about 200 Å to about 4000 Å, depending on the required resulting aspect ratio of the isolation width between adjacent electrodes. The deposition of the different layers of electrode materials is preferably done without breaking vacuum.

Optionally, after the bottom electrodes 38 have been formed on the substrate, the substrate is "sputter cleaned" in a high density plasma (HDP) PVD chamber to form tapered side walls for the electrodes. To sputter clean a substrate, a cleaning gas is introduced into the HDP-PVD processing chamber, and the substrate is biased to effectuate re-sputtering of the deposited material on the substrate surface, and a plasma of the cleaning gas is struck in the chamber to resputter a thin layer of platinum or other noble metals of the interface material onto the sides of the electrodes. Preferably, the side walls of the electrode is completely covered with the interface material, such as platinum, iridium, ruthenium and/or rhodium. Preferably, the sputter cleaning process is carried out at high temperature (>500° C.) and high vacuum (<10 mTorr) conditions in the HDP PVD chamber using an inert gas, such as argon, to sputter reactively. The re-sputtering of the interface material generally results in a tapered side wall 39 of the electrode 38, as shown in FIG. 2a, that facilitates subsequent deposition of the HDC material thereon.

In accordance with the invention, a tuned interface layer as described above dedicated for nucleation of the BST film is required to optimize and control the morphology and size of the grains for thin BST films (ie., about 200 Å to 300 Å thick with median grain size less than about 150 Å). With proper grain growth and nucleation, a thin film of BST can provide both a uniform HDC dielectric and low leakage current between the electrodes of the capacitor. By tuning the interface layer 50, the invention provides proper nucleation of the HDC dielectric material between the upper electrode and the lower electrode of a capacitor as well as between neighboring lower electrodes, resulting in reduction of lateral leakage current and elimination of coupling capacitance. The dielectric 40 separating the upper and lower electrodes preferably comprises barium strontium titanate (BST), although other HDC materials, including lead zirconate titanate (PZT), lead lanthanium titanate (PLT), barium titanate, strontium titanate and strontium bismuth titanate are contemplated by the present invention. These HDC materials can also be doped to prevent oxygen/ oxide defects from forming in the dielectric layer. For example, BST can be doped with manganese to improve leakage control. Preferably, the HDC dielectric 40 is between about 80 Å and about 800 Å thick.

To complete the capacitor structure, an upper electrode 36 is deposited over the HDC dielectric 40. Preferably, the upper electrode 36 comprises a material similar to the interface layer 50 of the lower electrode 38, and the upper electrode is between about 200 Å and about 2000 Å thick.

FIG. 6 is a cross sectional view of an alternative embodiment of the microelectronic device 130 having two alternative capacitor structures 132a and 132b of the present invention. The microelectronic device 130 includes an active device layer 131 and an insulator layer 134 as described above for FIG. 2. Each capacitor structure 132a and 132b includes an upper electrode 136, a lower electrode 138 and a high k dielectric 140 separating the upper and lower electrodes. The lower electrode 138 includes a conductive plug 142, a first barrier layer 144, a second barrier layer 146, a tuning layer 148 and an interface layer 150. Preferably, the combined thickness of the conductive plug 142, the first barrier layer 144 and the second barrier layer 146 does not exceed the thickness of the insulator layer 134. The tuning layer 148 is then deposited over the second barrier layer 146 and protrudes above the insulator layer 134. A conformal layer of the interface layer 150 is deposited over the top and sides of the tuning layer 148 to provide a tuned interface for the high k dielectric 140 on all exposed surfaces of the lower electrode 138. The high k dielectric layer 140 is deposited over the interface layer 150, and the upper electrode 136 is deposited over the dielectric layer 140.

One method of achieving this conformal interface layer 150 for the lower electrode 138 is as follows. Referring to FIG. 7, after the bottom layer 144, the barrier layer 146 and the tuning layer 148 have been deposited by PVD, CVD or other conventional deposition methods for these materials and etched by conventional methods to form a portion of the lower electrode, a layer of the interface material, such as platinum, is deposited over the substrate and then etched using conventional etching methods such as reactive ion etching with a photoresist pattern or mask to leave only the sides of the tuning layer 148 covered with a tapered layer 150a of the interface material. Referring now to FIG. 8, an oxide 149 is then deposited over the substrate, and a chemical mechanical polishing (CMP) step is performed to remove an upper portion of the deposited oxide to expose the upper surface of the tuning layer 148 and the upper surface of the interface material 150a on the side wall of the tuning layer 148. A second layer of interface material 150b is then deposited over the substrate. Because the substrate now has a flat upper surface, a mask, preferably a similar mask as the mask used for etching the tuning layer 148, can be placed over the substrate without substantial efforts to align the mask. The second layer of interface material and the oxide 149 are then etched using the mask to leave a conformal interface layer 150 over the tuning layer 148 as shown in FIG. 6. The conformal interface layer 150 as shown in FIG. 6 provides an improved nucleation of the HDC material because the interface layer 150 covers all of the lower electrode's surface for nucleation of the HDC material and the whole interface layer 150 is tuned by the tuning layer 148. By tuning the interface layer 150, the invention provides proper nucleation of the HDC dielectric material between the upper electrode and the lower electrode of a capacitor as well as between neighboring lower electrodes, resulting in reduction of lateral leakage current and elimination of coupling capacitance.

Figure 3:
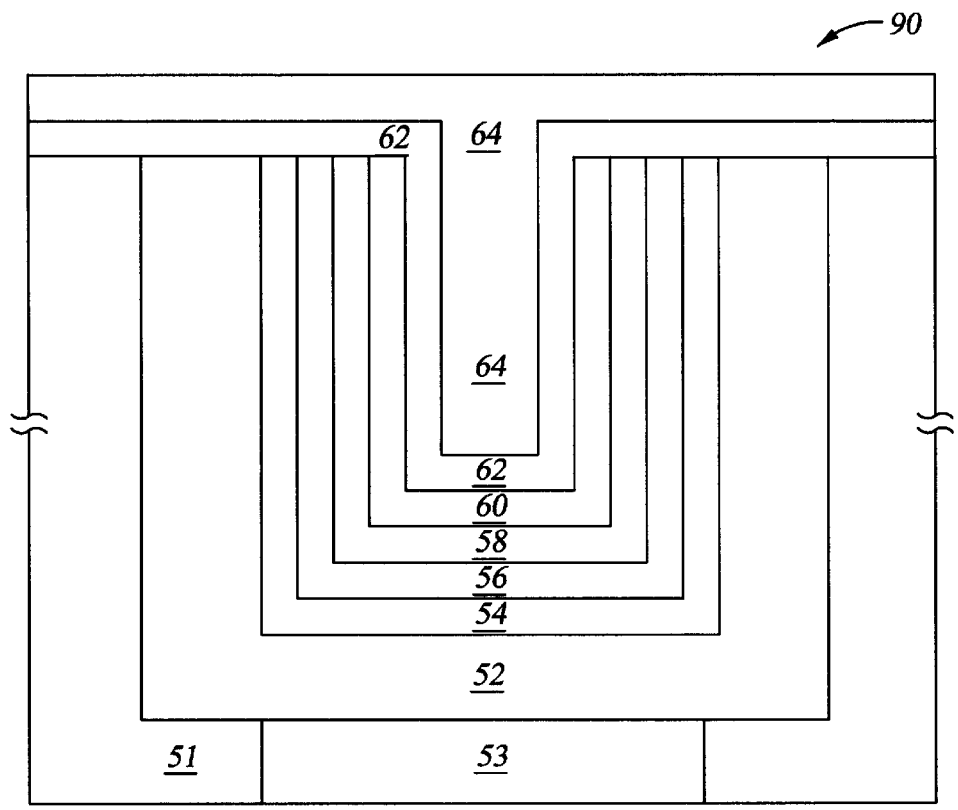
FIG. 3 is a cross sectional view of an alternative capacitor structure 50 for a high density semiconductor memory device.
Figure 4:
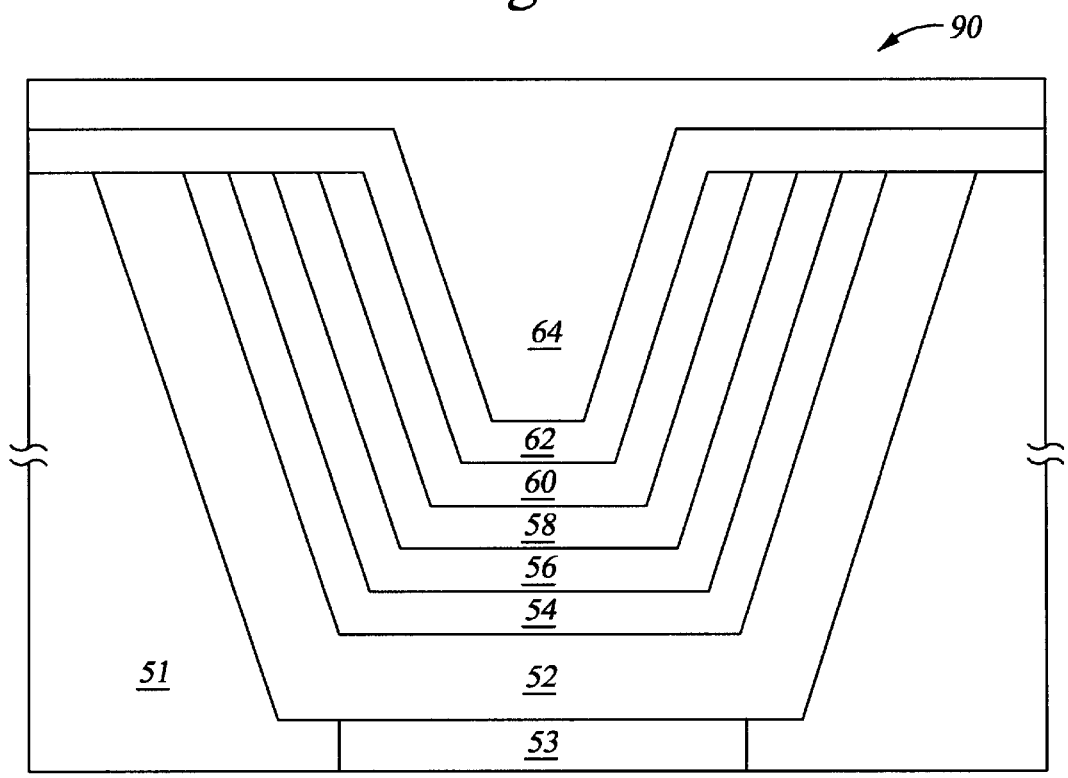
FIG. 4 is a cross sectional view of another alternative capacitor structure 50.

Another aspect of the invention provides a method and an apparatus for deposition into high aspect ratio features in high density memory devices having device designs of 0.3 μm or less and particularly design features of 0.15 μm or less, such as the capacitor structures in FIGS. 3 and 4. Specifically, the present invention provides high step coverage deposition of a tuning layer and an interface layer for nucleating a high k dielectric in a capacitor structure. The present invention utilizes a two-step process comprising first depositing a PVD film followed by a distribution and redeposition of the same film through HDP-PVD. The first PVD provides optimized deposition near the top of the aperture, and the HDP-PVD provides optimized distribution of the deposited material near the bottom of the aperture. The HDP-PVD also provides redeposition of deposited materials on the side walls of the aperture toward the bottom of the aperture. Through this two-step process, thin layers of material can be deposited within the aperture with uniform thickness at the side walls as well as the bottom of the aperture.

FIG. 3 is a cross sectional view of an alternative capacitor structure 90 for a high density semiconductor memory device. The capacitor structure 90 of this embodiment is disposed in a high aspect ratio (i.e., height:width ratio greater than 1:1) aperture having an aperture width of 0.3 μm or less. The high aspect ratio aperture is disposed on a silicon oxide surface 51 of the substrate, and a first layer 52, preferably comprising polysilicon between about 50 Å and about 2000 Å thick, is deposited within the aperture and connected to a polysilicon plug 53 that extends through the silicon oxide layer 51 to serve as a conductive member to connect the capacitor structure with other devices on the substrate. The capacitor structure 90 comprises a titanium layer 54, a titanium nitride barrier layer 56, a tuning layer 58, a lower electrode interface layer 60, a high k dielectric layer 62 and an upper electrode layer 64. Because these layers are disposed inside a high aspect ratio device feature, the deposition of each layer decreases the aperture opening and each subsequent layer requires a better step coverage because of the increased aspect ratio.

An alternative capacitor structure 90 is shown in FIG. 4. This structure provides sloped side walls in the aperture to facilitate uniform distribution within the aperture. This capacitor structure contains the same layering of materials as described above. Compared to an aperture with side walls disposed perpendicular to the substrate surface having the same size opening, an aperture with sloped side walls provides a lower effective aspect ratio such that uniform deposition within the aperture can be accomplished more easily.

Referring to FIGS. 3 and 4, the titanium layer 54 and the titanium nitride layer 56 serve as diffusion barriers that prevent silicon from diffusing through the bottom electrode and forming silicon oxide at the interface between the electrode and the dielectric. Preferably, the diffusion barrier layers are between about 50 Å and about 500 Å thick. Materials that can be used to form the barrier layers include titanium, titanium nitride, titanium aluminum nitride, tantalum, tantalum nitride, tantalum aluminum nitride and combinations thereof. A tuning layer 58 for controlling the nucleation of the electrode interface layer 60 is then deposited over the barrier layers. The tuning layer 58 preferably comprises a material such as ruthenium oxide ($RuO_2$), ruthenium combined with ruthenium oxide ($Ru/RuO_2$), iridium oxide ($IrO_2$), iridium combined with iridium oxide ($Ir/IrO_2$), titanium aluminum nitride (TiAlN) and combination thereof. Preferably, the tuning layer is between about 50 Å and about 1000 Å thick. The tuning layer 58 interface with the electrode interface layer 60 is optimized on the basis of matching stress and the desired grain growth of the high k dielectric, such as BST, to be deposited on the electrode interface layer 60. The electrode interface layer 60 is deposited over the tuning layer 58 and exhibits the desired nucleation and grain growth for nucleation of the HDC layer 62 to be deposited thereon. Preferably, the electrode interface layer 60 comprises a metal selected from the group comprising platinum, ruthenium, iridium, rhodium, platinum combined with rhodium, platinum combined with iridium, platinum combined with ruthenium and combinations thereof, and the electrode interface layer is between about 100 Å and about 2000 Å thick. These four layers (the barrier layers, the tuning layer and the electrode interface layer) together make up the lower electrode of the capacitor structure. Preferably, the bottom electrode layers are deposited within the aperture (on the side walls and the bottom of the aperture) without protruding above the surface of the substrate by using selective deposition and/or by using an intermediate chemical mechanical polishing (CMP) step.

Next, a HDC material 62 is deposited over the electrode interface layer 60. The preferred HDC material according to the present invention is BST. However, other HDC materials can be used as well, including lead zirconate titanate, lead lanthanium titanate, barium titanate, strontium titanate and strontium bismuth titanate. The HDC material according to the present invention is a thin film (about 200 Å to about 300 Å) and still demonstrates behavior properties approaching bulk behavior because of proper nucleation provided by a tuned electrode interface layer. Preferably, the HDC layer is between about 80 Å and about 800 Å thick. The electrode interface layer 60 provides a nucleation surface for the HDC material which provides proper grain growth of the HDC material. The HDC material is deposited within the aperture as the dielectric between the capacitor electrodes, and the HDC material is also deposited over the substrate surface/field as an insulator between the top electrode and the substrate. Then the top electrode layer 64, preferably comprising the same material as the interface layer 60, is deposited over the HDC layer 62, preferably completely filling the aperture of the capacitor structure. The top electrode layer 64 is preferably between about 200 Å and about 2000 Å thick. Although the preferred range of thicknesses of the different layers are described with respect to a feature having an opening less than 300 nanometers wide, the thicknesses can be varied according the feature sizes and requirements.

Figure 5:
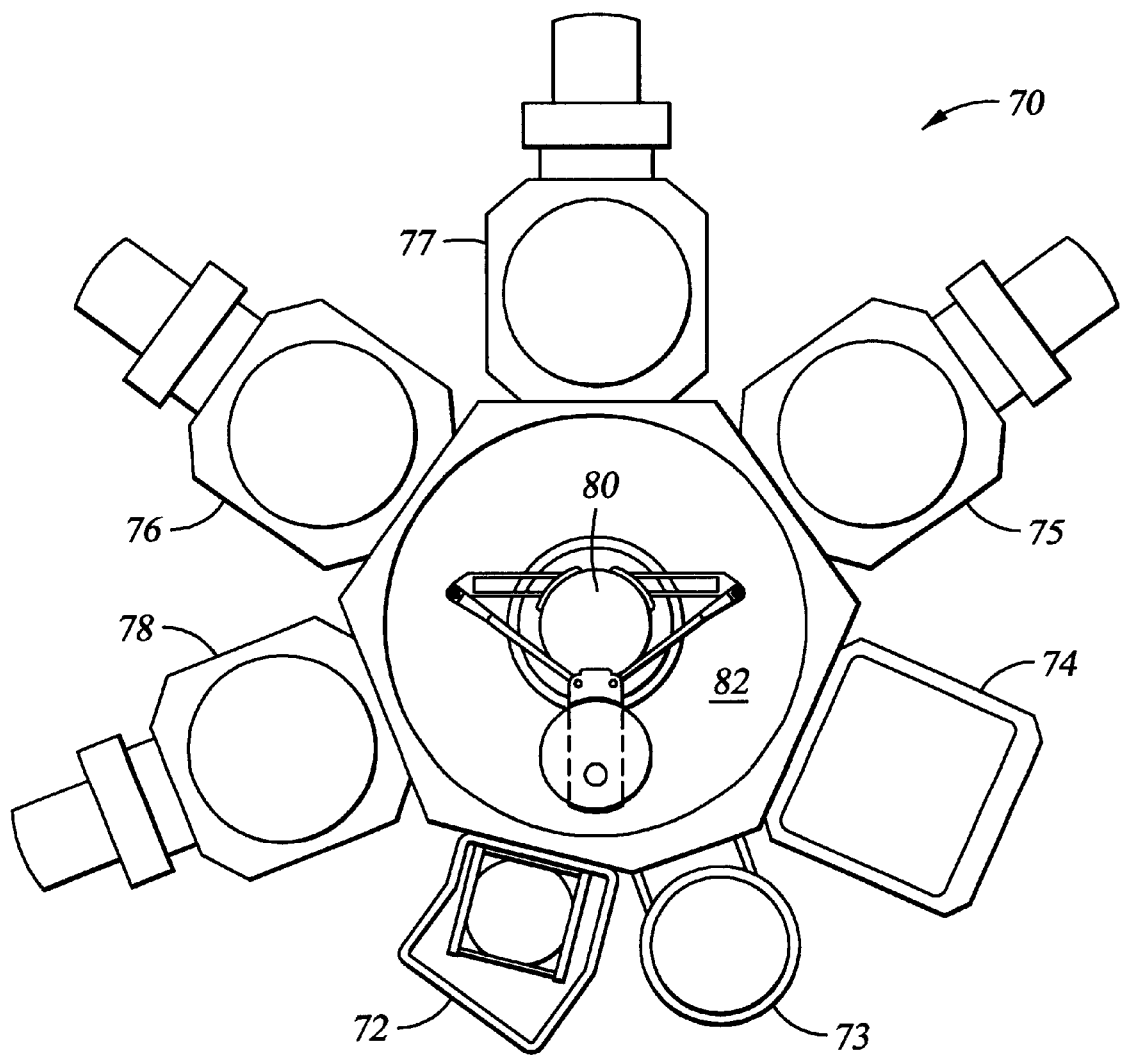
FIG. 5 is a schematic view of an integrated semiconductor processing system of the present invention.

The above described two-step PVD process for deposition within high aspect ratio apertures is preferably carried out in a semiconductor processing system having a HDP-PVD chamber. FIG. 5 is a schematic view of an integrated semiconductor processing system for carrying out the processes and forming the devices of the invention. The processing system 70 preferably includes a loadlock chamber 72 for transferring a substrate into and out of the processing system 70, a plurality of processing chambers such as a pre-clean/degas chamber 73, an etch chamber 74, a CVD chamber 75 and a CMP chamber 77, a PVD chamber 76 and a HDP-PVD chamber 78. A transfer robot 80 is disposed in a transfer chamber 82 to transport a substrate between the chambers in the processing system 70.

To accomplish deposition of a particular layer of material within a high aspect ratio aperture on a substrate such as each of the layers of the capacitor structures as in FIG. 3 or FIG. 4, the substrate is first transported into the PVD chamber 76, and the material is deposited by PVD which is optimized for deposition near the top of the aperture. The substrate is then transported into the HDP-PVD chamber 78, where deposition is optimized for the bottom of the aperture, and the same material is deposited again and distributed uniformly within the aperture. The HDP-PVD chamber 78 also redistributes the excess material from the side walls of the aperture toward the bottom of the aperture, improving uniform thickness of the deposition within the aperture. During the HDP-PVD process, preferably, the HDP-PVD chamber is operated at typical processing condition such as pedestal/heater temperature of about 200° C.; process gas flow of about 25 sccm, chamber pressure of about 15 mT, RF coil power of about 2.5 kW to generate the high density plasma, target bias voltage of about −342 V and DC power of about 4 kW, and pedestal/substrate RF bias power of between about 200 W and about 500 W at about 13.56 MHz. Preferably, the deposition to etch ratio during the HDP-PVD process is at least 1:1.

While the foregoing is directed to the preferred embodiment of the present invention, other and further embodiments of the invention may be devised without departing from the basic scope thereof. The scope of the invention is determined by the claims which follow.

We claim:

1. A method for forming a capacitor on a substrate, comprising:
 a) depositing a bottom layer over a conductor plug in the substrate;
 b) depositing a tuning layer over the bottom layer;
 c) depositing an interface layer over the tuning layer;
 d) re-sputtering the interface layer to conformally cover the tuning layer and the bottom layer;
 e) depositing a high k dielectric layer over the interface layer, wherein the high k dielectric layer has a thickness of about 80 angstroms to about 800 angstroms; and
 f) depositing an upper electrode layer over the dielectric layer.

2. A method for forming a capacitor in a high aspect ratio feature, comprising:
 a) depositing a tuning layer in the feature by physical vapor deposition;
 b) distributing and redepositing the tuning layer by high density plasma physical vapor deposition;
 c) depositing an interface layer over the tuning layer by physical vapor deposition;
 d) distributing and redepositing the interface layer by high density plasma physical vapor deposition;
 e) depositing a high k dielectric layer over the interface layer, wherein the high k dielectric layer has a thickness of about 80 angstroms to about 800 angstroms; and
 f) depositing an upper electrode layer over the high k dielectric layer.

3. The method of claim 2 wherein the tuning layer comprises a material selected from the group comprising ruthenium oxide, ruthenium combined with ruthenium oxide, iridium oxide, iridium combined with iridium oxide, titanium aluminum nitride and combinations thereof.

4. The method of claim 2 wherein the interface layer comprises a material selected from the group comprising platinum, ruthenium, iridium, rhodium, platinum combined with rhodium, platinum combined with iridium, platinum combined with ruthenium and combinations thereof.

5. The method of claim 2, further comprising:
 g) depositing a barrier layer in the feature before depositing the tuning layer.

6. The method of claim 5 wherein the barrier layer comprises titanium, titanium nitride, titanium aluminum nitride, tantalum, tantalum nitride, tantalum aluminum nitride, and combinations thereof.

7. The method of claim 5 wherein the barrier layer is titanium aluminum nitride.

8. The method of claim 5 wherein the barrier layer has a thickness of about 50 angstroms to about 500 angstroms.

9. The method of claim 2 wherein the tuning layer has a thickness of about 50 angstroms to about 1,000 angstroms.

10. The method of claim 2 wherein the interface layer is a combination material comprising platinum combined with rhodium, platinum combined with iridium, platinum combined with ruthenium, and combinations thereof.

11. The method of claim 10 wherein the combination material comprises about 75% to about 90% platinum.

12. The method of claim 2 wherein the interface layer has a thickness of about 200 angstroms to about 4,000 angstroms.

13. The method of claim 2 wherein the high k dielectric layer comprises barium strontium titanate, lead zirconate titanate, lead lanthanium titanate, barium titanate, strontium titanate, and strontium bismuth titanate.

14. The method of claim 13 wherein the high k dielectric layer is doped.

15. The method of claim 2 wherein the high k dielectric layer has a thickness of about 200 angstroms to about 300 angstroms.

16. The method of claim 2 wherein the high k dielectric layer has a median grain thickness of less than 150 angstroms.

17. The method of claim 2 wherein the upper electrode layer comprises platinum, ruthenium, iridium, rhodium, platinum combined with rhodium, platinum combined with iridium, platinum combined with ruthenium, and combinations thereof.

18. A method for forming a capacitor on a substrate, comprising:
   a) depositing a bottom layer over a conductor plug in the substrate;
   b) depositing a barrier layer over the bottom layer;
   c) depositing a tuning layer over the barrier layer;
   d) depositing an interface layer over the tuning layer, wherein the tuning layer controls the microstructure of the interface layer;
   e) depositing a high k dielectric layer over the interface layer; and
   f) depositing an upper electrode layer over the dielectric layer.

19. A method for forming a capacitor on a substrate, comprising:
   depositing a bottom layer over a conductor plug in the substrate;
   depositing a barrier layer on the bottom layer;
   depositing a tuning layer over the barrier layer by physical vapor deposition;
   depositing an interface layer over the tuning layer, wherein the tuning layer controls the microstructure of the interface layer;
   depositing a high k dielectric layer over the interface layer, wherein the high k dielectric layer has a thickness of about 80 angstroms to about 800 angstroms; and
   depositing an upper electrode layer over the dielectric layer.

20. The method of claim 19, wherein the tuning layer comprises ruthenium oxide, ruthenium combined with ruthenium oxide, iridium oxide, iridium combined with iridium oxide, titanium aluminum nitride and combinations thereof.

21. The method of claim 19, wherein the interface layer comprises platinum, ruthenium, iridium, rhodium, and combinations thereof.

22. The method of claim 19, wherein the bottom layer comprises titanium, titanium nitride, titanium aluminum nitride, tantalum, tantalum nitride, tantalum aluminum nitride, and combinations thereof.

23. The method of claim 19, wherein the bottom layer is titanium.

24. The method of claim 19, wherein the bottom layer has a thickness of about 50 angstroms to about 500 angstroms.

25. The method of claim 19, wherein the barrier layer comprises titanium, titanium nitride, titanium aluminum nitride, tantalum, tantalum nitride, tantalum aluminum nitride, and combinations thereof.

26. The method of claim 19, wherein the barrier layer is titanium aluminum nitride.

27. The method of claim 19, wherein the barrier layer has a thickness of about 50 angstroms to about 500 angstroms.

28. The method of claim 19, wherein the tuning layer has a thickness of about 50 angstroms to about 1,000 angstroms.

29. The method of claim 19, wherein the interface layer is a combination material comprising platinum combined with rhodium, platinum combined with iridium, platinum combined with ruthenium, and combinations thereof.

30. The method of claim 29, wherein the combination material comprises about 75% to about 90% platinum.

31. The method of claim 19, wherein the interface layer has a thickness of about 200 angstroms to about 4,000 angstroms.

32. The method of claim 19, wherein the high k dielectric layer comprises barium strontium titanate, lead zirconate titanate, lead lanthanium titanate, barium titanate, strontium titanate, and strontium bismuth titanate.

33. The method of claim 32, wherein the high k dielectric layer is doped.

34. The method of claim 19, wherein the high k dielectric layer has a thickness of about 200 angstroms to about 300 angstroms.

35. The method of claim 19, wherein the upper electrode layer comprises platinum, ruthenium, iridium, rhodium, platinum combined with rhodium, platinum combined with iridium, platinum combined with ruthenium, and combinations thereof.

36. The method of claim 19, wherein the upper electrode layer has a thickness of about 200 angstroms to about 4,000 angstroms.

37. The method of claim 19, wherein the high k dielectric layer has a median grain thickness of less than 150 angstroms.

* * * * *

UNITED STATES PATENT AND TRADEMARK OFFICE
CERTIFICATE OF CORRECTION

PATENT NO.    : 6,358,810 B1
DATED         : March 19, 2002
INVENTOR(S)   : Dornfest et al.

It is certified that error appears in the above-identified patent and that said Letters Patent is hereby corrected as shown below:

Column 1,
Line 61, please change "0.31µm" to -- 0.3 µm --.

Column 2,
Line 67, please change "0.31µm" to -- 0.3 µm --.

Column 3,
Line 43, please change "thereofThe" to -- thereof. The --.

Column 4,
Line 62, please change "thereofAs" to -- thereof. As --.

Column 6,
Line 3, please change "TIAIN" to -- TiAlN --.

Signed and Sealed this

Fifth Day of August, 2003

JAMES E. ROGAN
*Director of the United States Patent and Trademark Office*